(12) United States Patent
Pellizzer

(10) Patent No.: US 7,244,956 B2
(45) Date of Patent: Jul. 17, 2007

(54) SELF-ALIGNED PROCESS FOR MANUFACTURING A PHASE CHANGE MEMORY CELL AND PHASE CHANGE MEMORY CELL THEREBY MANUFACTURED

(75) Inventor: Fabio Pellizzer, Follina (IT)

(73) Assignees: STMicroelectronics S.r.l., Agrate Brianza (IT); OVONYX, Inc., Boise, ID (US)

( * ) Notice: Subject to any disclaimer, the term of this patent is extended or adjusted under 35 U.S.C. 154(b) by 0 days.

(21) Appl. No.: 10/824,631

(22) Filed: Apr. 14, 2004

(65) Prior Publication Data

US 2005/0001284 A1   Jan. 6, 2005
US 2007/0057341 A9   Mar. 15, 2007

Related U.S. Application Data

(63) Continuation-in-part of application No. 10/313,991, filed on Dec. 5, 2002.

(30) Foreign Application Priority Data

Dec. 5, 2001   (EP)  ................................ 01128461
Apr. 16, 2003  (EP)  ................................ 03425235

(51) Int. Cl.
*H01L 47/00*   (2006.01)
*H01L 29/02*   (2006.01)

(52) U.S. Cl. .................. 257/2; 257/3; 257/4; 257/5; 365/158; 365/171; 365/200

(58) Field of Classification Search ............... 257/2–5; 365/200, 158, 171
See application file for complete search history.

(56) References Cited

U.S. PATENT DOCUMENTS

| | | | |
|---|---|---|---|
| 6,316,784 B1 | 11/2001 | Zahorik et al. | 257/3 |
| 6,440,837 B1 | 8/2002 | Harshfield | 438/618 |
| 6,512,241 B1 | 1/2003 | Lai | 257/4 |
| 6,545,287 B2 | 4/2003 | Chiang | 257/3 |
| 6,891,747 B2 * | 5/2005 | Bez et al. | 365/158 |
| 2002/0017701 A1 | 2/2002 | Klersy et al. | 257/536 |
| 2003/0047762 A1 | 3/2003 | Lowrey | 257/276 |
| 2003/0231530 A1 * | 12/2003 | Bez et al. | 365/200 |

FOREIGN PATENT DOCUMENTS

WO    WO 02/09206 A1    1/2002

* cited by examiner

*Primary Examiner*—Kenneth Parker
*Assistant Examiner*—Joseph Nguyen
(74) *Attorney, Agent, or Firm*—Lisa K. Jorgenson; Hai Han; Seed IP Law Group PLLC

(57) ABSTRACT

A process for manufacturing a phase change memory cell, comprising the steps of: forming a resistive element; forming a delimiting structure having an aperture over the resistive element; forming a memory portion of a phase change material in the aperture, the resistive element and the memory portion being in direct electrical contact and defining a contact area of sublithographic extension. The step of forming a memory portion further includes filling the aperture with the phase change material and removing from the delimiting structure an exceeding portion of the phase change material exceeding the aperture.

26 Claims, 14 Drawing Sheets

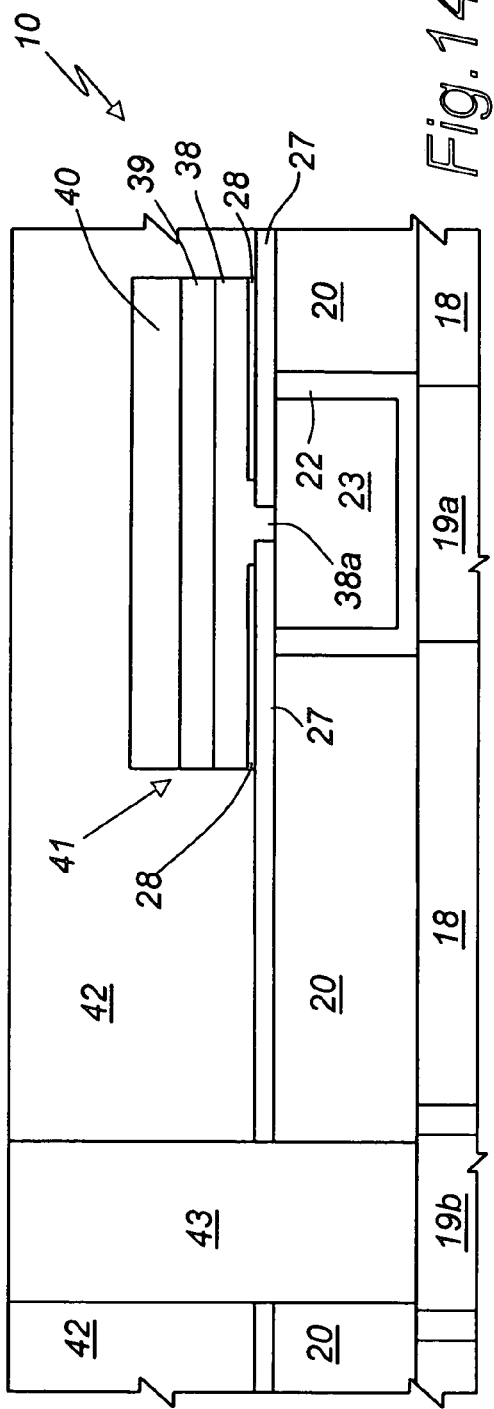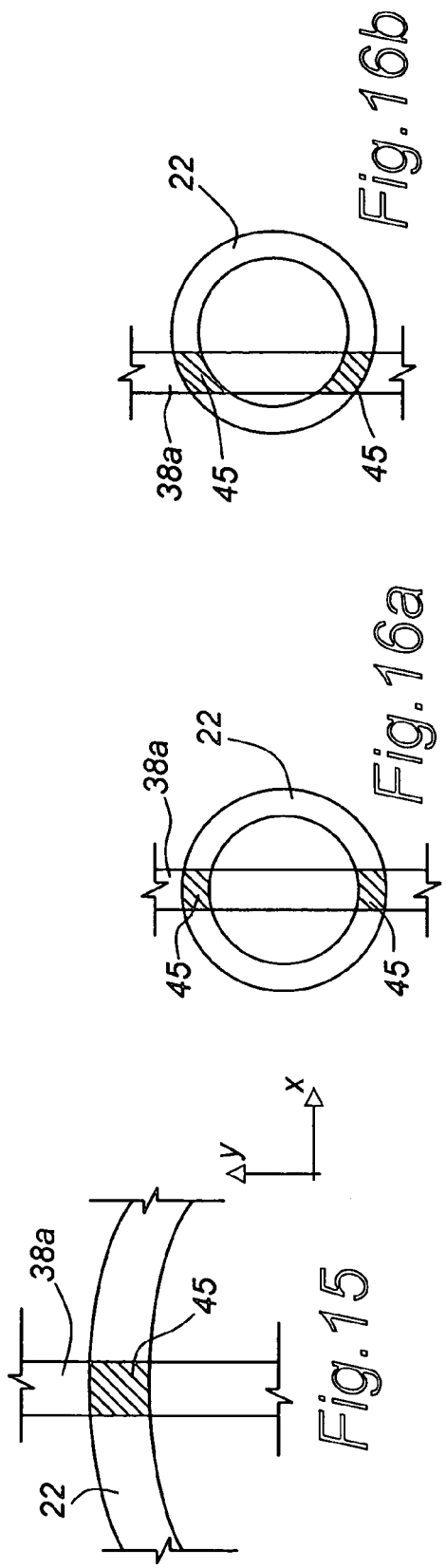

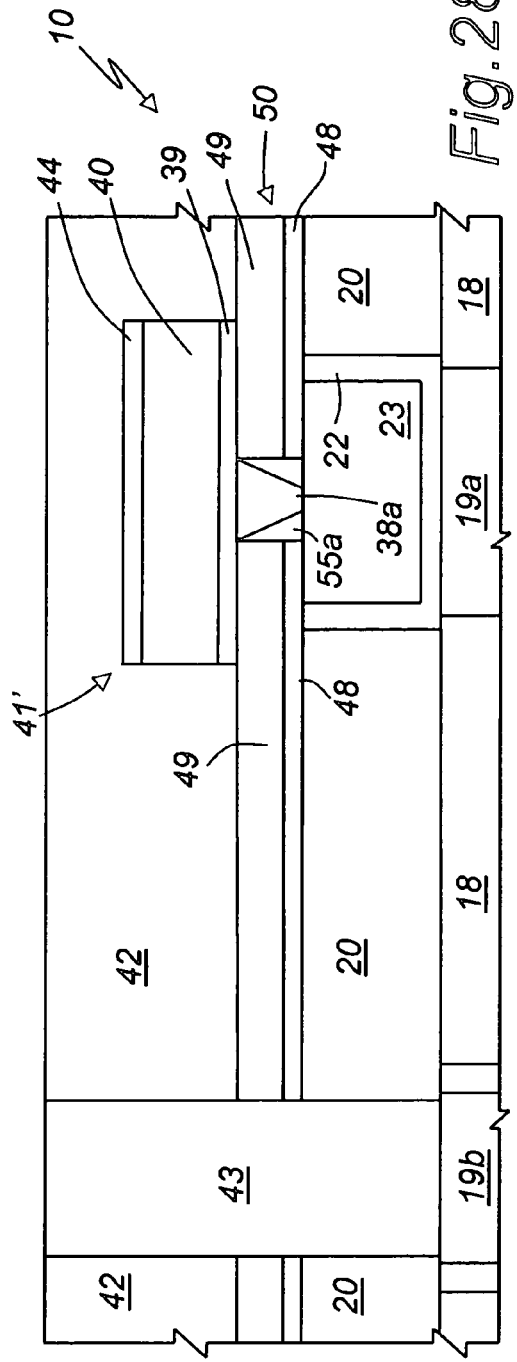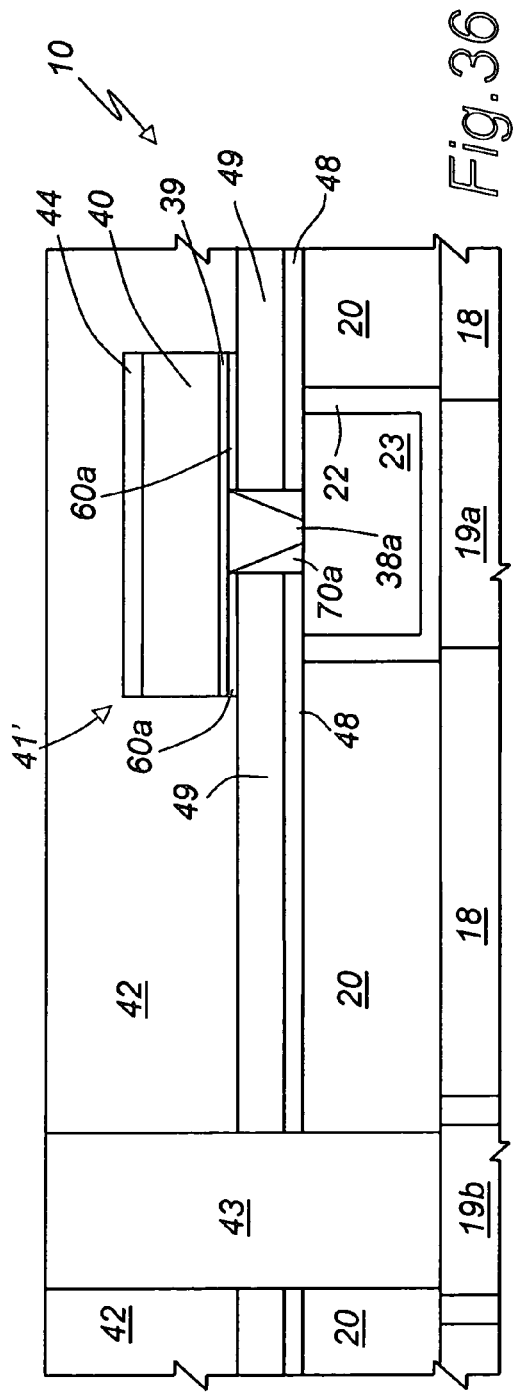

SELF-ALIGNED PROCESS FOR MANUFACTURING A PHASE CHANGE MEMORY CELL AND PHASE CHANGE MEMORY CELL THEREBY MANUFACTURED

BACKGROUND OF THE INVENTION

1. Field of the Invention

The present invention relates to a self-aligned process for manufacturing a phase change memory cell and to a phase change memory cell thereby manufactured.

2. Description of the Related Art

As is known, phase change memory (PCM) elements exploit the characteristics of materials which have the property of changing between two phases having distinct electrical characteristics. For example, these materials may change from an amorphous phase, which is disordered, to a crystalline or polycrystalline phase, which is ordered, and the two phases are associated to considerably different resistivities.

At present, alloys of group VI of the periodic table, such as Te or Se, referred to as chalcogenides or chalcogenic materials, can advantageously be used in phase change cells. The chalcogenide that currently offers the best promises is formed by a Ge, Sb and Te alloy ($Ge_2Sb_2Te_5$) and is widely used for storing information in overwritable disks.

In chalcogenides, the resistivity varies by two or more orders of magnitude when the material passes from the amorphous phase (more resistive) to the polycrystalline phase (more conductive) and vice versa. The characteristics of chalcogenides in the two phases are shown in FIG. 1. As may be noted, at a given read voltage, here designated by Vr, there is a resistance variation of more than 10.

Phase change may be obtained by locally increasing the temperature, as shown in FIG. 2. Below 150° C. both phases are stable. Above 200° C. (temperature of start of nucleation, designated by $T_x$), fast nucleation of the crystallites takes place, and, if the material is kept at the crystallization temperature for a sufficient length of time (time $t_2$), it changes its phase and becomes crystalline. To bring the chalcogenide back into the amorphous state, it is necessary to raise the temperature above the melting temperature $T_m$ (approximately 600° C.) and then to cool the chalcogenide off rapidly (time $t_1$).

From the electrical standpoint, it is possible to reach both critical temperatures, namely the crystallization temperature and the melting point, by causing a current to flow through a resistive element which heats the chalcogenic material by the Joule effect.

The basic structure of a PCM element 1 which operates according to the principles described above is shown in FIG. 3 and comprises a resistive element 2 (heater) and a programmable element 3. The programmable element 3 is made of a chalcogenide and is normally in the polycrystalline state in order to enable a good flow of current. One part of the programmable element 3 is in direct contact with the resistive element 2 and forms the area affected by phase change, hereinafter referred to as the phase change portion 4.

If an electric current having an appropriate value is caused to pass through the resistive element 2, it is possible to heat the phase change portion 4 selectively up to the crystallization temperature or to the melting temperature and to cause phase change. In particular, if a current I flows through a resistive element 2 having resistance R, the heat generated is equal to $I^2R$.

The use of the PCM element of FIG. 3 for forming memory cells has already been proposed. In order to prevent noise caused by adjacent memory cells, the PCM element is generally associated to a selection element, such as a MOS transistor, a bipolar transistor, or a diode.

All the known approaches are, however, disadvantageous due to the difficulty in finding solutions that meet present requirements as regards capacity for withstanding the operating currents and voltages, as well as functionality and compatibility with present CMOS technologies.

In particular, considerations of a technological and electrical nature impose the creation of a contact area of small dimensions, preferably 20 nm×20 nm, between the chalcogenic region and a resistive element. The problem is that these dimensions are much smaller than those that can be obtained with current optical (UV) lithographic techniques, which scarcely reach 100 linear nm.

BRIEF SUMMARY OF THE INVENTION

An embodiment of the invention provides a phase change memory cell and a fabrication process thereof, with particular regard to the issue of the poor adhesion between the chalcogenic material and the non-conductive molding layer.

In particular, according to one embodiment of the present invention, a phase change memory cell is fabricated by forming a resistive element and a delimiting structure having an aperture over the resistive element. The memory portion is obtained by filling the aperture with a phase change material, such as a chalcogenic material, followed by removing any phase change material exceeding the aperture. The resistive element and the memory portion are in direct electrical contact and defining a contact area of sublithographic dimension. According to another embodiment of the invention, the memory portion is sealed within the aperture by a sealing structure deposited directly on top of the delimiting structure.

BRIEF DESCRIPTION OF THE SEVERAL VIEWS OF THE DRAWING(S)

For a better understanding of the present invention, some preferred embodiments thereof are now described, purely by way of non-limiting example, with reference to the attached drawings, in which:

FIGS. 7–14 are cross-section of the structure of the above mentioned patent application, in successive manufacture steps;

FIG. 15 is a top plan view, with parts removed and at an enlarged scale, of a detail of FIG. 14;

FIGS. 16a and 16b are top plan views, with parts removed, of a detail of FIG. 14, under two different manufacture conditions;

FIG. 28 is a cross-section, similar to FIG. 14, in a final manufacture step according to the first embodiment of the invention;

FIG. 36 is a cross-section, similar to FIG. 14, in a final manufacture step according to the third embodiment of the invention.

DETAILED DESCRIPTION OF THE INVENTION

U.S. application Ser. No. 10/313,991, filed Dec. 5, 2002, and entitled "Small area contact region, high efficiency phase change memory cell, and manufacturing method thereof", teaches forming the contact area as an intersection of two thin portions extending transversely with respect to one another and each of a sublithographic size. In order to form the thin portions, deposition of layers is adopted instead of a lithographic process, given that deposition makes it possible to obtain very thin layers, i.e., having a thickness much smaller than the current minimum size that can be achieved using lithographic techniques.

For a better understanding of the problem of the present invention, the manufacturing process object of the above mentioned U.S. patent application Ser. No. 10/313,991 will now be described.

Figure 4:
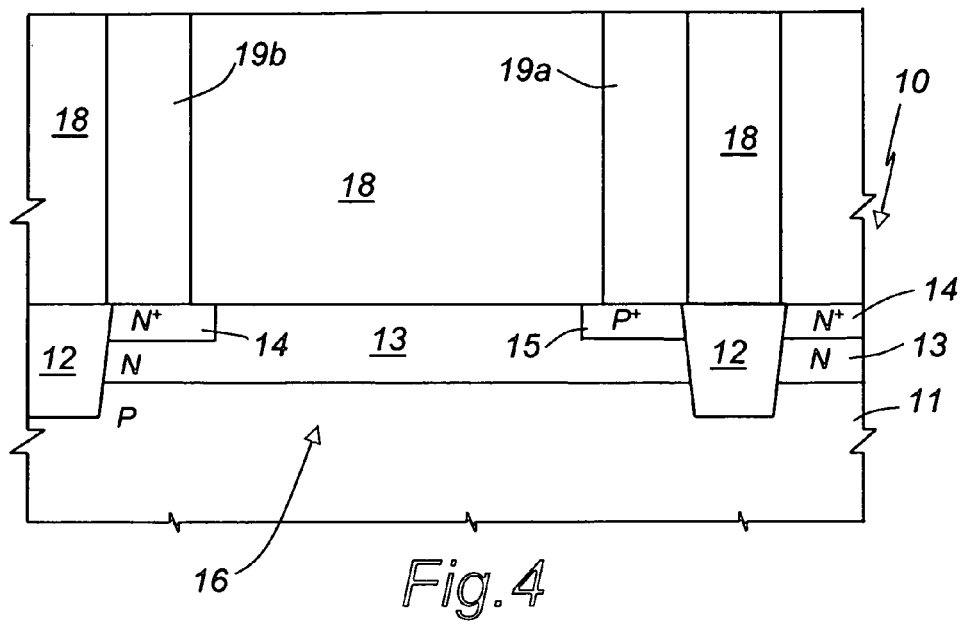
FIG. 4 shows a cross section of a wafer of semiconductor material in a manufacturing step of the cell of FIG. 3, according to the aforementioned patent application.

With reference to FIG. 4, initially a wafer 10 comprising a P-type substrate 11 is subjected to standard front end steps. In particular, inside the substrate 11 insulation regions 12 are formed and delimit active areas 16; then N-type base regions 13 are implanted.

Next, a first dielectric layer 18 is deposited and planarized; openings are formed in the first dielectric layer 18 above the base regions 13. At this point, using two dedicated masks and exploiting the self-alignment in the openings, N$^+$-type base contact regions 14 and P$^+$-type emitter regions 15 are implanted. Then the openings in the first dielectric layer 18 are covered by a barrier layer, for example a Ti/TiN layer, before being filled with tungsten to form base contacts 19b and emitter contacts 19a. The base contacts 19b are thus in electrical contact with the base regions 13, and the emitter contacts 19a are in direct electrical contact with the emitter regions 15. In this way, the structure of FIG. 4 is obtained. The base regions 13, base contact regions 14, and emitter regions 15 form diodes that form selection elements for the memory cells.

Figure 5:
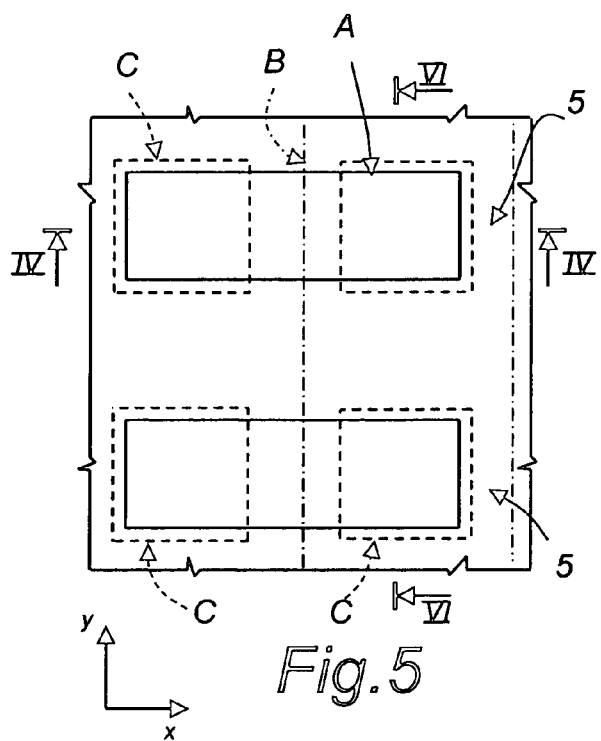
FIG. 5 shows the layout of some masks used for forming the structure of FIG. 4.
Figure 6:
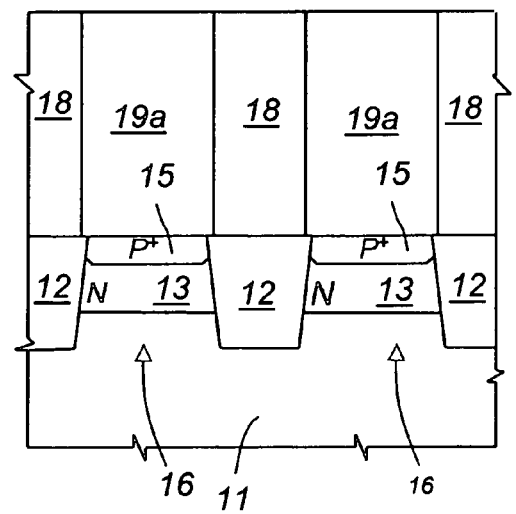
FIG. 6 is a cross-section taken along line VI—VI of FIG. 5.

FIG. 5 shows the layout of some masks used for forming the structure of FIG. 4 regarding a pair of memory cells 5 that are adjacent in a perpendicular direction to the sectional plane of FIG. 4 (Y direction). In particular, the figure shows a mask A used for defining the active areas 16, a mask B used for implanting the emitter regions 15, and a mask C for forming the openings where the base contacts 19b and the emitter contacts 19a are to be formed. FIG. 4 is a cross-section taken along line IV—IV of FIG. 5, while FIG. 6 shows the same structure sectioned along the section line VI—VI of FIG. 5.

Figure 1:
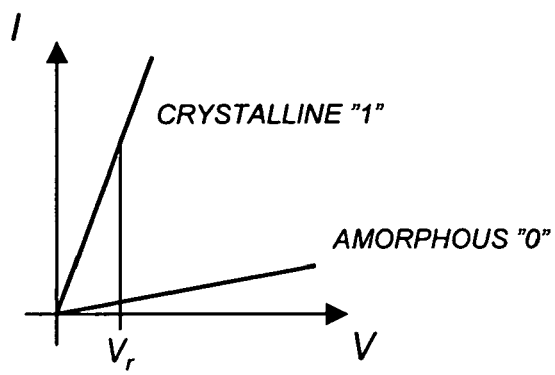
FIG. 1 shows the current versus voltage characteristic of a phase change material.
Figure 2:
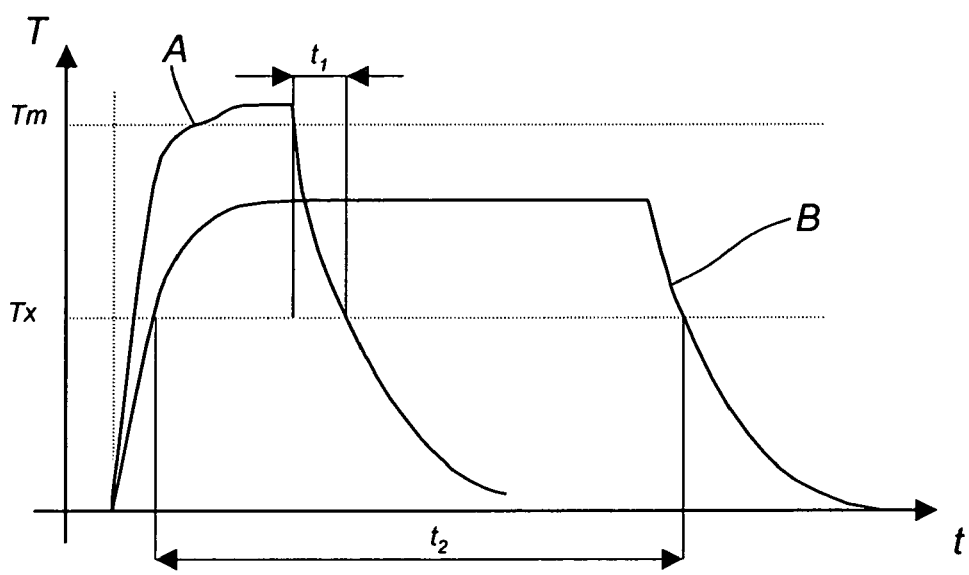
FIG. 2 shows the temperature versus current plot of a phase change material.
Figure 3:
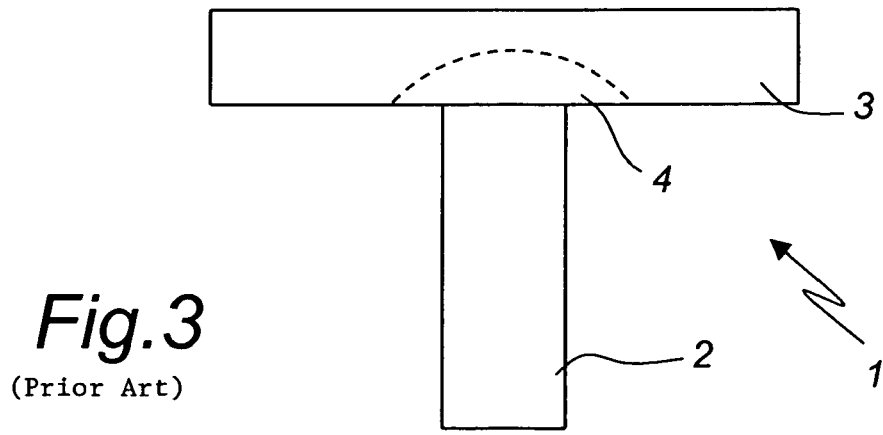
FIG. 3 shows the basic structure of a PCM memory element.

Next (FIG. 7), a second dielectric layer 20—for example, an undoped silicon glass (USG) layer—is deposited, and openings 21 are formed in the second dielectric layer 20 above the emitter contact 19a. The openings 21 have dimensions dictated by the lithographic process and are, for example, circle-shaped. Next, a heating layer, for example of TiSiN, TiAlN or TiSiC, is deposited for a thickness of 10–50 nm, preferably 20 nm. The heating layer, designed to form the resistive element 2 of FIG. 3, conformally coats the walls and bottom of the openings 21. The openings 21 are then completely filled with dielectric material 23. Advantageously the dielectric material 23 is the same used for forming the dielectric layer 20. The heating layer is removed outside the openings 21 by CMP ("Chemical Mechanical Polishing") and the surface of the wafer 10 is planarized. The remaining portions of the heating layer form cup-shaped regions 22 that, in a top view, are visible as rings of conductive heating material immersed in the dielectric layer 20 and surrounding the dielectric material 23.

Figure 8:
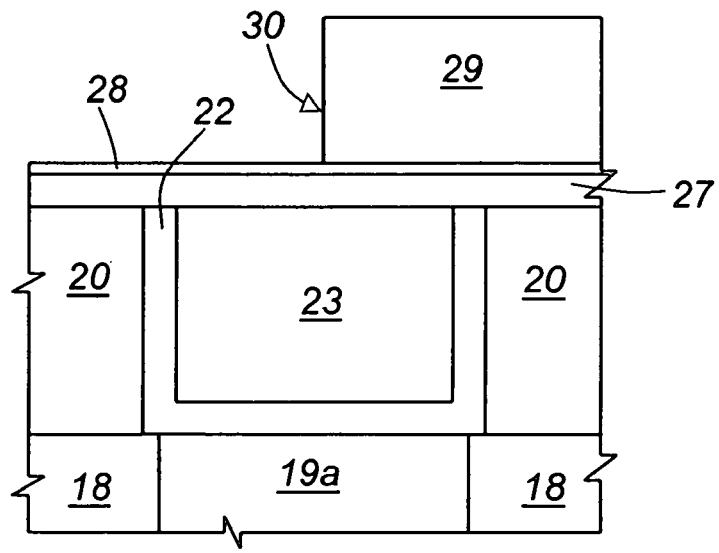

Next, as shown in the enlarged detail of FIG. 8, a mold layer 27, for instance USG having a thickness of 20 nm, an adhesion layer 28, for instance Ti or Si with a thickness of 5 nm, and a first delimiting layer 29, for example nitride or another material that enables selective etching with respect to the adhesion layer 28, are deposited in sequence. The first delimiting layer 29 has a thickness of, for instance, 150 nm. Then, using a mask, one part of the first delimiting layer 29 is removed by dry etching to form a step which has a vertical side 30 that extends vertically on top of the dielectric material 23. The structure shown in FIG. 8 is thus obtained.

Figure 9:
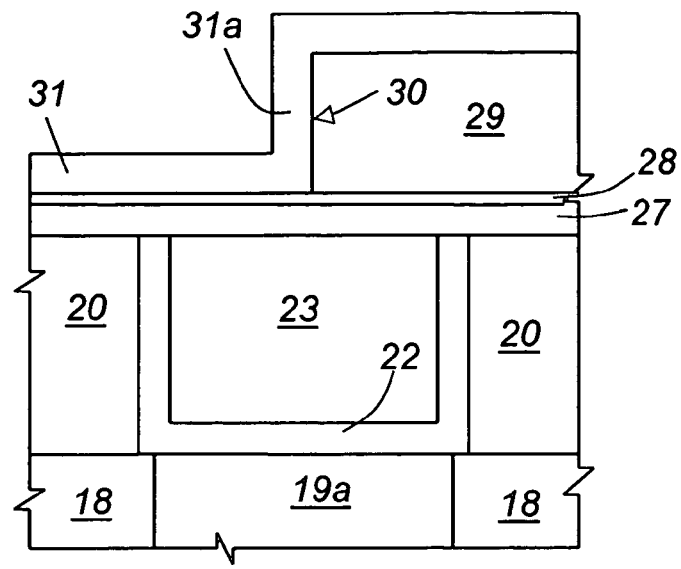

Next (FIG. 9), a sacrificial layer 31, for example TiN with a thickness of 30 nm, is deposited conformally. In particular, the sacrificial layer forms a vertical wall 31a that extends along the vertical side 30 of the first delimiting layer 29.

Figure 10:
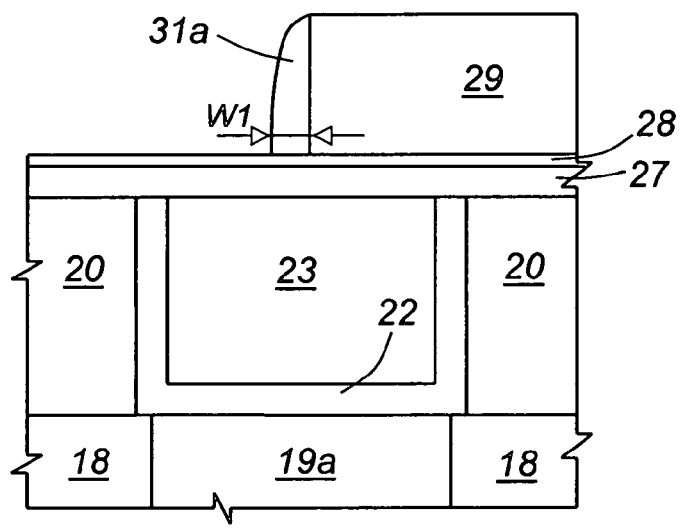

Next (FIG. 10), the sacrificial layer 31 undergoes an etch back that results in the removal of the horizontal portions of the sacrificial layer 31 and of part of the vertical wall 31a. By appropriately choosing the thickness of the first delimiting layer 29 and the thickness of the sacrificial layer 31, as well as the time and type of etching, it is possible to obtain the desired sublithographic width W1 for the bottom part of the remaining vertical wall 31a.

Figure 11:
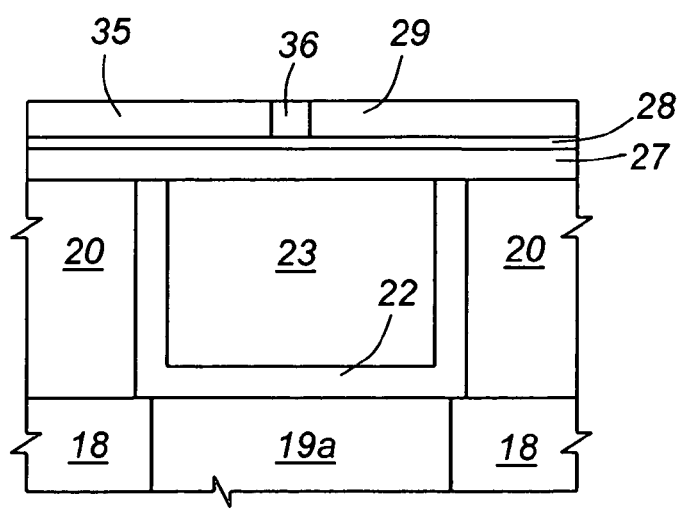

As shown in FIG. 11, a second delimiting layer 35, of the same material as the first delimiting layer 29, for example nitride, with a thickness of 300 nm, is deposited. Next, the delimiting layers 29, 35 and the vertical wall 31a are thinned by chemical mechanical polishing (CMP). At the end, the remaining portions of the delimiting layers 29, 35 form a hard mask, and the remaining portion of the vertical wall 31a forms a sacrificial region 36.

Figure 12:
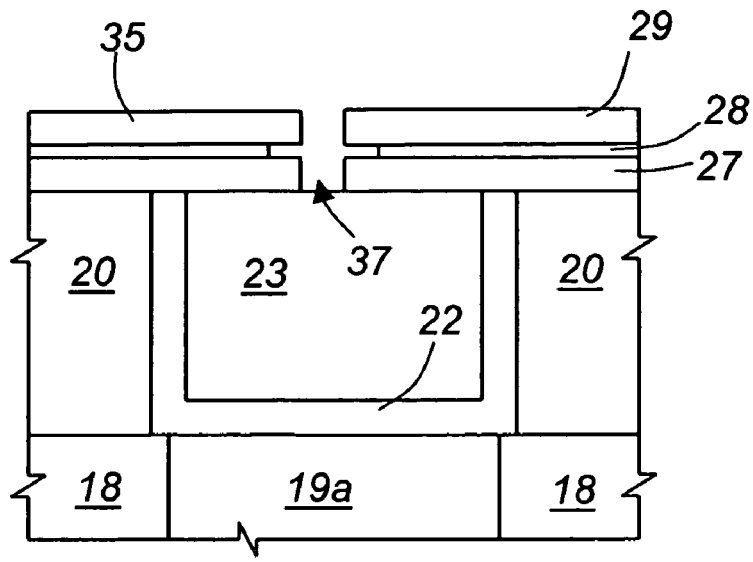

Next (FIG. 12), the sacrificial region 36 is removed. The adhesion layer 28 is isotropically etched, and the mold layer 27 is dry etched to form an aperture 37 in the mold layer 27, the aperture 37 having a width W1 equal to the width of the sacrificial region 36.

Figure 13:
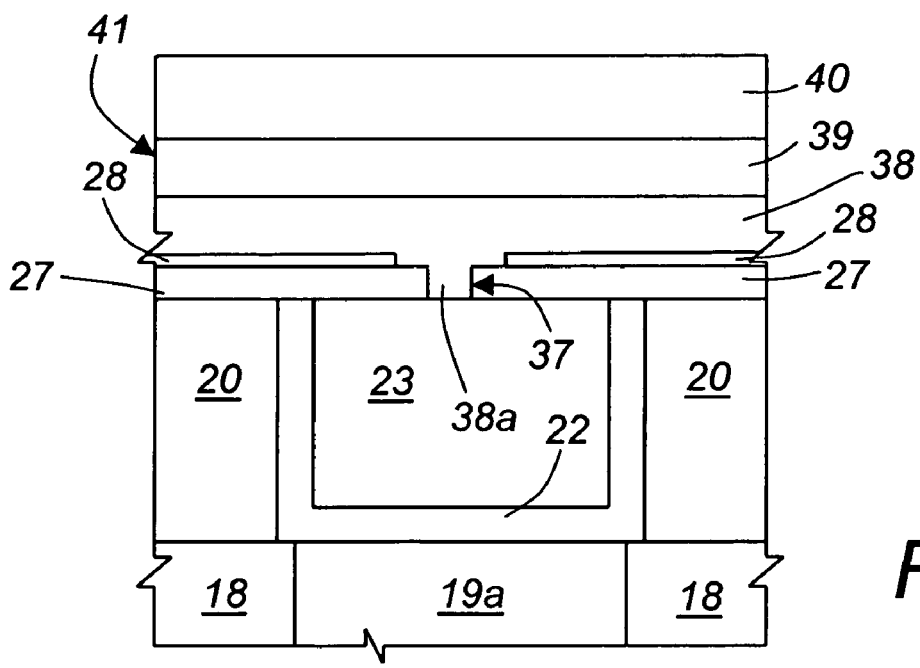

Next (FIG. 13), the delimiting layers 29, 35 are removed, and a chalcogenic layer 38, for example of $Ge_2Sb_2Te_5$ with a thickness of 60 nm, is deposited conformally. The portion 38a of the chalcogenic layer 38 fills the aperture 37 and forms, at the intersection with the cup-shaped region 22, a phase change region similar to the phase change portion 4 of FIG. 3. Then, on top of the chalcogenic layer 38, a barrier layer 39, for example of Ti/TiN, and a metal layer 40, for example of AlCu, are deposited. The structure of FIG. 13 is thus obtained.

Next (FIG. 14), the stack formed by the metal layer 40, barrier layer 39, chalcogenic layer 38, and adhesion layer 28 is defined using a same mask to form a bit line 41. Finally, a third dielectric layer 42 is deposited, planarized, for example by CMP, and then opened above the base contacts 19b and above a portion (not shown) of the bit line 41. The openings thus formed are filled with tungsten to form top contacts 43 in order to prolong upwards the base contacts 19b. Then standard steps are performed for forming the connection lines for connection to the base contacts 19b and to the bits lines 41, and the final structure of FIG. 14 is thus obtained.

In practice, as shown in FIG. 15, the intersection between the cup-shaped region 22 and the thin portion 38a of the chalcogenic layer 38 forms a contact area 45 which is approximately square and has sublithographic dimensions. This is due to the fact that both the cup-shaped region 22 and the thin portion 38a have a width equal to the thickness of a deposited layer. In fact, the width of the cup-shaped region 22 is given by the thickness of the heating layer, and the width of the thin portions 38a is determined by the thickness of the sacrificial layer 31 along the vertical side 30. In greater detail, in the proximity of the contact area 45, the cup-shaped region 22 has a sublithographic dimension in a first direction (Y direction), and the thin portion 38a has a sublithographic dimension (width W1 of FIG. 10) in a second direction (X direction) which is transverse to the first direction. Hereinafter, the term "sublithographic dimension" means a linear dimension smaller than the minimum di current optical (UV) lithographic techniques, and hence smaller than 100 nm, preferably 50–60 nm, down to approximately 5–20 nm.

In the process described above, it is necessary to deal with the issue of fixing the chalcogenic layer 38 exceeding the thin portion 38a which fills the aperture 37. In fact, the chalcogenic layer 38 does not adhere tightly to the mold layer 27, which is made of USG or other dielectric material. Hence, the chalcogenic layer 38 can delaminate from the mold layer 27. In particular, the deposition of the chalcogenic layer 38 is followed by process steps that require heating and thermal stress, such as annealing, oxidation, barrier and metallic layer deposition. As is known, the risk of detachment of the chalcogenic layer 38 is particularly high during process steps which involve thermal stress. Thus, the intermediate adhesion layer 28 of a suitable adhering material, such as Ti or Si, must be provided. However, this solution is not fully satisfactory. On the one hand, the adhesion layer 28 must extend by a quite large amount over the mold layer 27 to provide enough adhesion surface area for the chalcogenic layer 38. As a result, the bit line 41, which is formed on the chalcogenic layer 38 and the adhesion layer 28, is also rather wide. On the other hand, the stack comprising the adhesion layer 28, the chalcogenic layer 38, the barrier layer 39 and the metal layer 40 is some hundreds nanometers high. However, the adhesion layer 28 and the chalcogenic layer 38 together contribute at least 60–100 nm to the entire height of the stack. In other words, a substantial part of the overall dimension of the stack is required for the sole purpose of preventing detachment of the chalcogenide.

Accordingly, a process that allows for reducing the overall dimensions of the phase change memory cell and a phase change memory cell having reduced overall dimensions are desirable.

Moreover, forming the thin portion 38a of the chalcogenic layer 38 entails numerous steps and is somewhat complex. Consequently, it is desirable to have a simpler alternative process.

In the following description of the present invention, parts that are the same as those previously described with reference to FIGS. 4–14 are designated by the same reference numbers.

Figure 7:
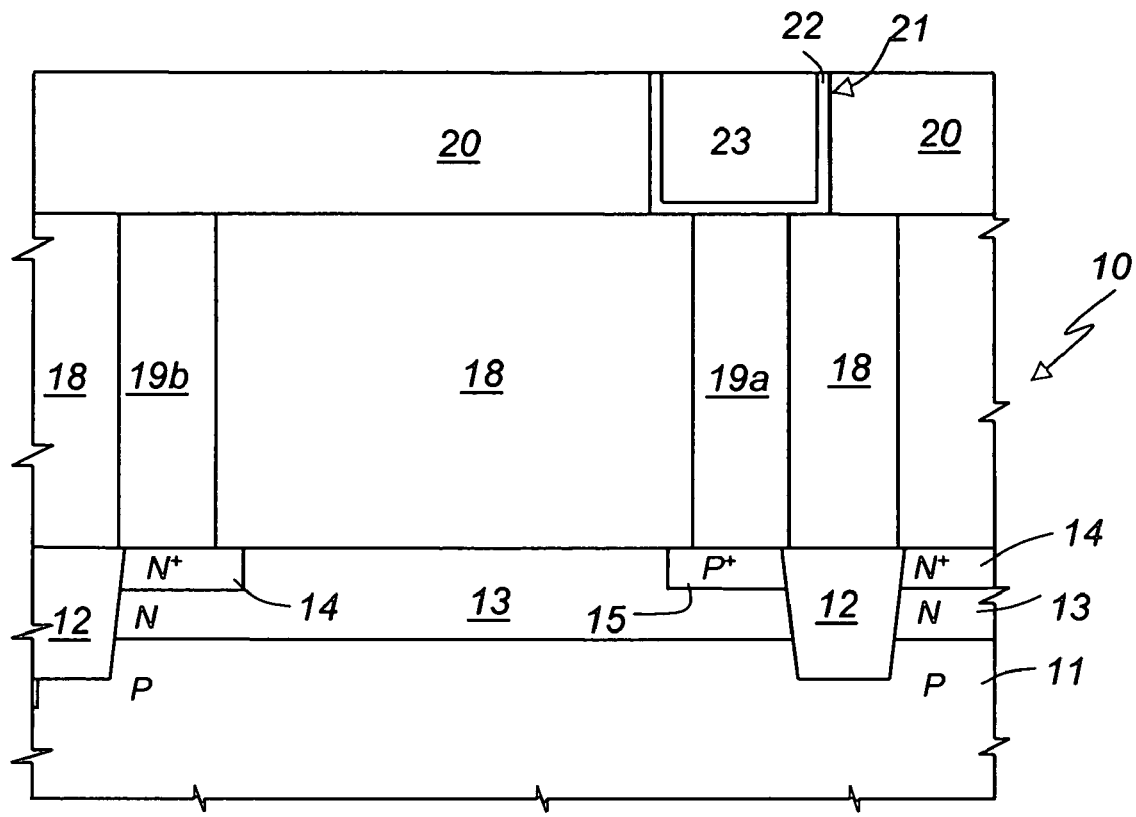
Figure 17:
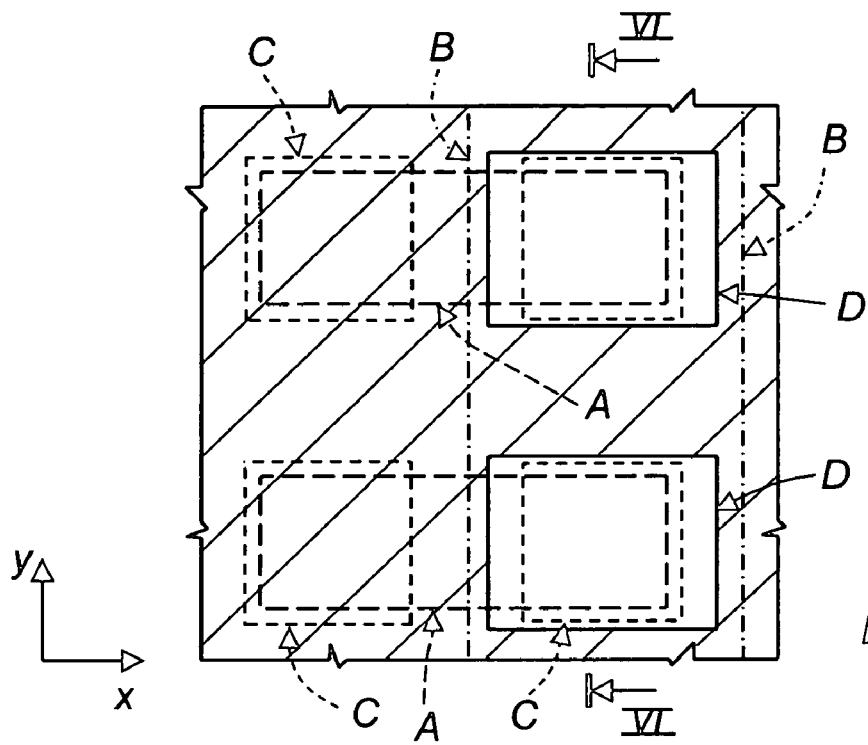
FIG. 17 shows the layout of some masks used for forming the structure of FIG. 7, according to the invention.
Figure 22:
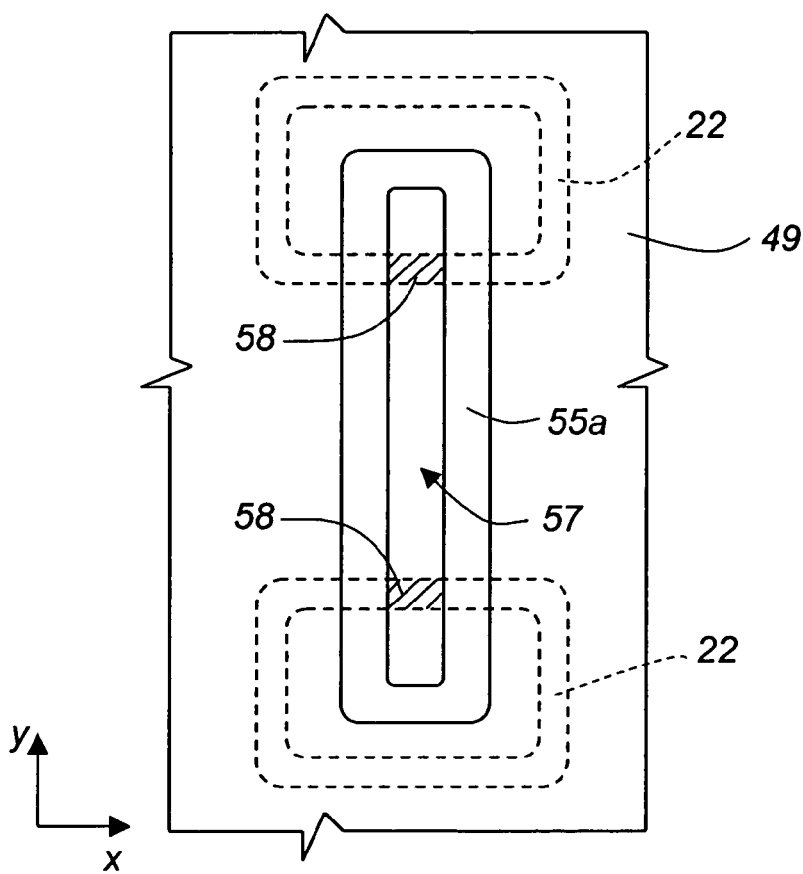
FIG. 22 is a top plan view of the structure of FIG. 21.

One embodiment of the present invention comprises the initial steps equal to those described in U.S. patent application Ser. No. 10/313,991, illustrated above, up to deposition of the second dielectric layer 20 (FIG. 7). Next, the openings 21 and the cup-shaped regions 22 are formed. However, as shown in FIG. 17, for the definition of the openings 21, a heater mask D is used which has rectangular windows (the term "rectangular" also comprising the particular case of a square shape). Consequently, the openings 21 have a substantially rectangular shape. Then the heating layer, for example of TiSiN, TiAlN or TiSiC, with a thickness of 10–50 nm, preferably 20 nm, is deposited. The heating layer coats the walls and bottom of the openings 21 conformally. The openings 21 are then filled with dielectric material 23 and the heating layer is removed outside the openings 21, e.g., by CMP, to form the cup-shaped regions 22. Consequently, in top plan view, the cup-like regions 22 here define an ideally rectangular shape, possibly with rounded edges (on account of the lithographic limits), or at the most an ovalized shape, with the longer side, or main direction, parallel to the X direction (FIG. 22).

Figure 18:
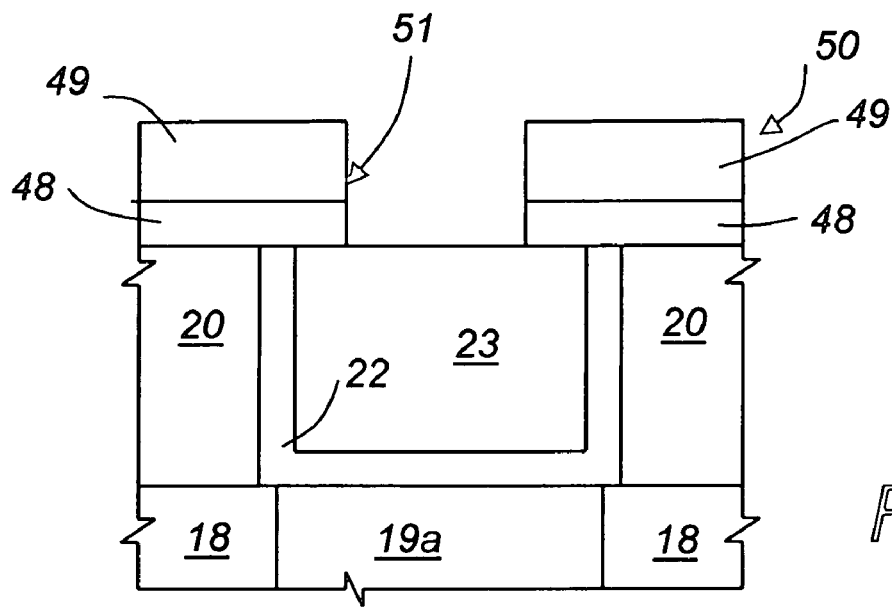
FIG. 18 is a cross-section similar to FIG. 8, in a manufacture step according to a first embodiment of the invention.

Then (FIG. 18), a stop layer 48, for example of nitride deposited by PECVD (Plasma Enhanced Chemical Vapor Deposition) with a thickness of 40 nm, and a mold layer 49, for example of USG deposited by PECVD or SACVD (Sub-Atmopshperic Chemical Vapor Deposition) with a thickness of 50–70 nm, are deposited in sequence, so as to form a minitrench stack 50.

Figure 19:
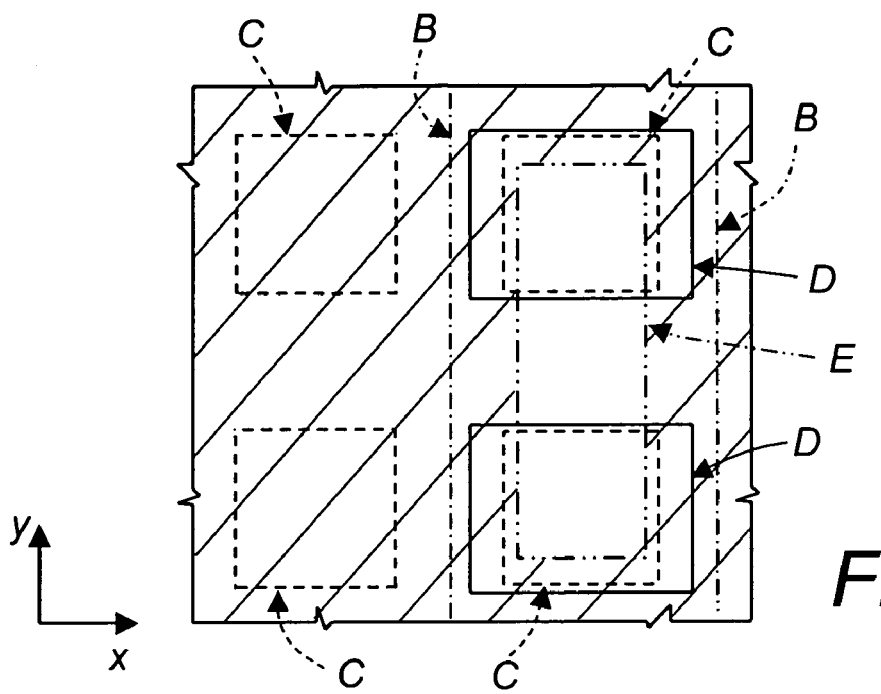
FIG. 19 shows the layout of some masks used for forming the structure of FIG. 18.

Next, using a minitrench mask, designated by E in FIG. 19, the mold layer 49 and the stop layer 48 are etched. As shown in FIG. 19, the minitrench mask E has a rectangular window that extends between two adjacent cells 5 in the Y direction (perpendicular to the alignment direction of the base and emitter regions 14, 15 of each memory cell 5, FIG. 7).

With subsequent etching, part of the minitrench stack 50 (layers 48 and 49) is removed, so as to form an opening 51 having a rectangular shape, corresponding to that of the minitrench mask E. The width of the opening 51 in the X direction is, for example, 160 nm. The opening 51 uncovers part of the dielectric material 23 of the two adjacent cells 5 and crosses each cup-shaped region 22 only once, as can be clearly seen from the superposition of the heater mask D and minitrench mask E in FIG. 19.

Figure 20:
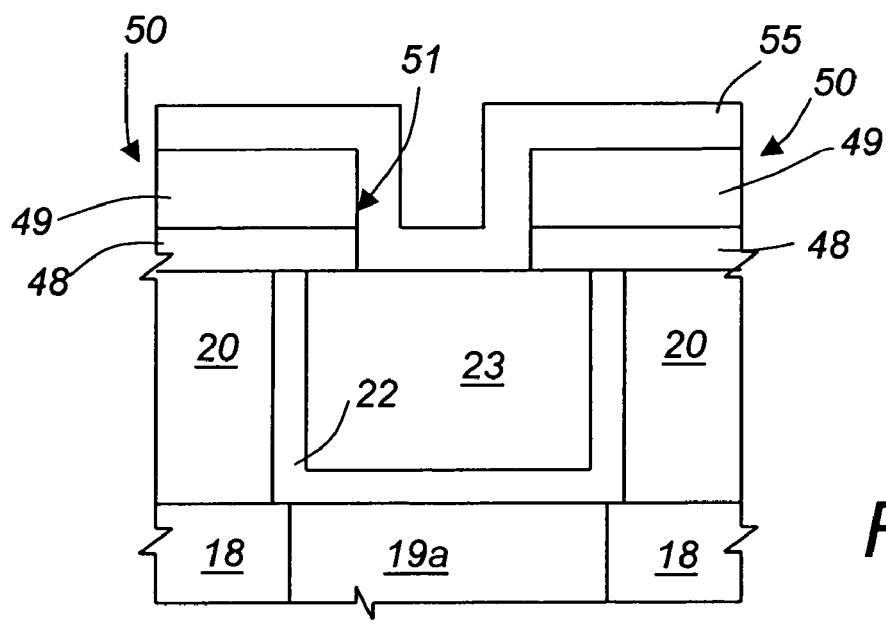
FIGS. 20 and 21 are cross-sections, similar to FIG. 18, in successive manufacture steps according to the first embodiment of the invention.

Next, as shown in FIG. 20, a spacer layer 55, for example an oxide layer, is deposited (in particular, TEOS with a thickness of 50 nm). The spacer layer 55 covers the mold layer 49, as well as the walls and bottom of the opening 51.

Figure 21:
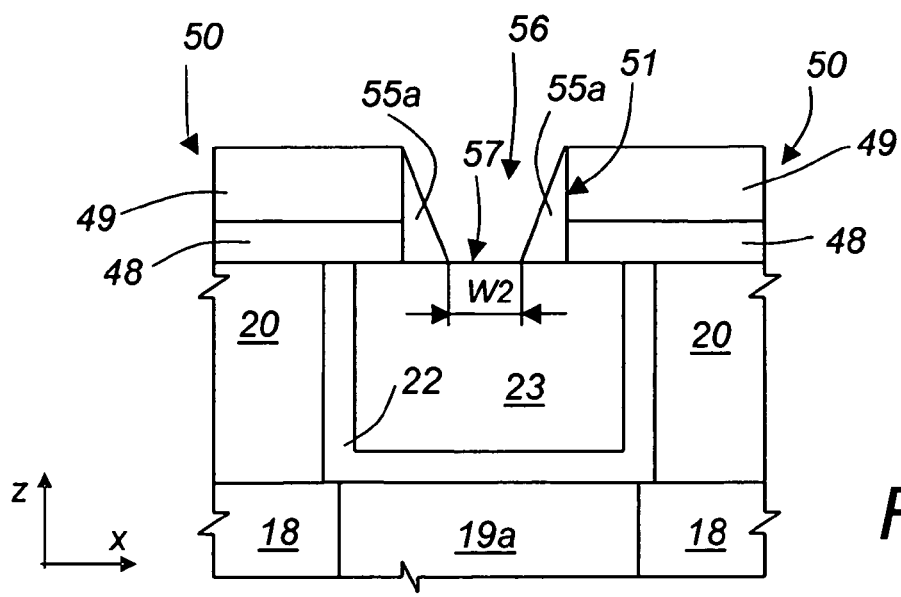

Then, as shown in FIG. 21, the spacer layer 55 is anisotropically etched by etching back until the horizontal portions thereof are removed, according to the well known spacer formation technique. The spacer layer 55 is then completely removed above the mold layer 49 and is partially removed from the bottom of the opening 51 to form a spacer region 55a which extends along the vertical sides of the opening 51 (along the perimeter of a rectangle or of an oval) and delimits an aperture 56, the base whereof forms a rectangular strip 57 having a sublithographic width W2 (in the X direction) of approximately 60 nm. FIG. 22 is a top plan view of the structure thus obtained, and highlights how the strip 57 uncovers only one portion of the cup-shaped region 22 of each cell 5, shown with dashed line in the figure. The uncovered portion of each cup-shaped region 22 forms a contact area 58, as will be explained hereinafter.

Thus, in one embodiment, the present invention provides a first cup-shaped resistive element having a substantially vertical wall, said vertical wall having a top surface of sublithographic thickness; a second cup-shaped resistive element having a substantially vertical wall, said vertical wall having a top surface of sublithographic thickness; a delimiting structure with an aperture having a first portion over the first resistive element and a second portion over the second resistive element; a first memory portion of phase change material in the first portion of said aperture, the first memory portion being in contact with the first resistive element and defining a first contact area of sublithographic dimension, and a second memory portion of phase change material in the second portion of said aperture, the second memory portion being in contact with the second resistive element and defining a second contact area of sublithographic dimension.

Figure 23:
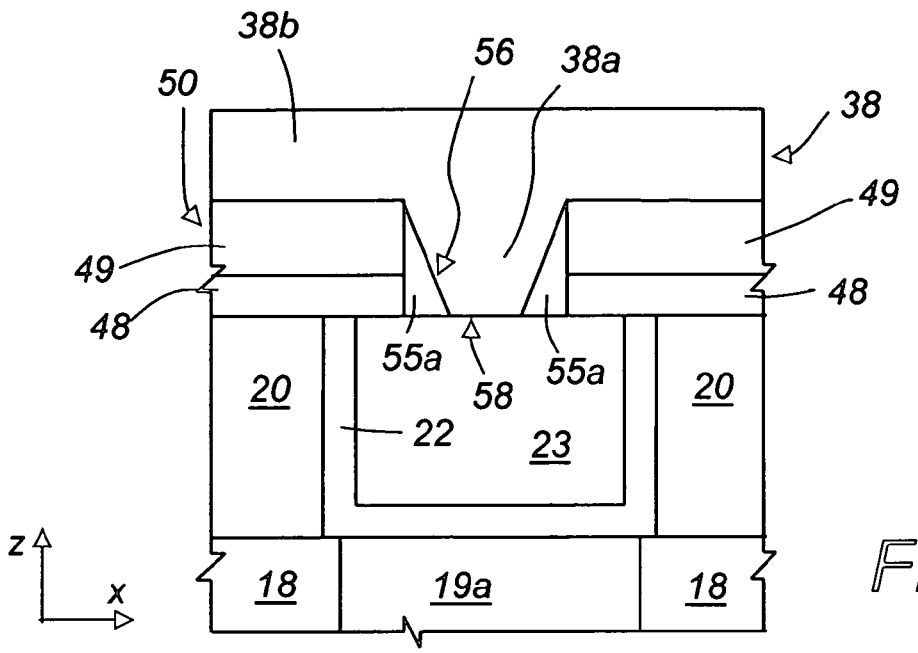
FIGS. 23–26 are cross-sections, similar to FIG. 21, in subsequent manufacture steps.

Next, as shown in FIG. 23, the chalcogenic layer 38 is deposited (also in the present case, for instance, of $Ge_2Sb_2Te_5$ with a thickness of 60 nm). The chalcogenic layer 38 is in direct contact with the mold layer 49 and fills the aperture 56 with a thin portion 38a. In particular, the thin portion 38a of the chalcogenic layer 38 deposits on the strip 57, contacting the cup-shaped regions 22 at the contact areas 58. The inclined wall formed by the spacer region 55a favors filling of the aperture 56, so preventing problems linked to a poor aspect ratio of the opening 51.

Figure 24:
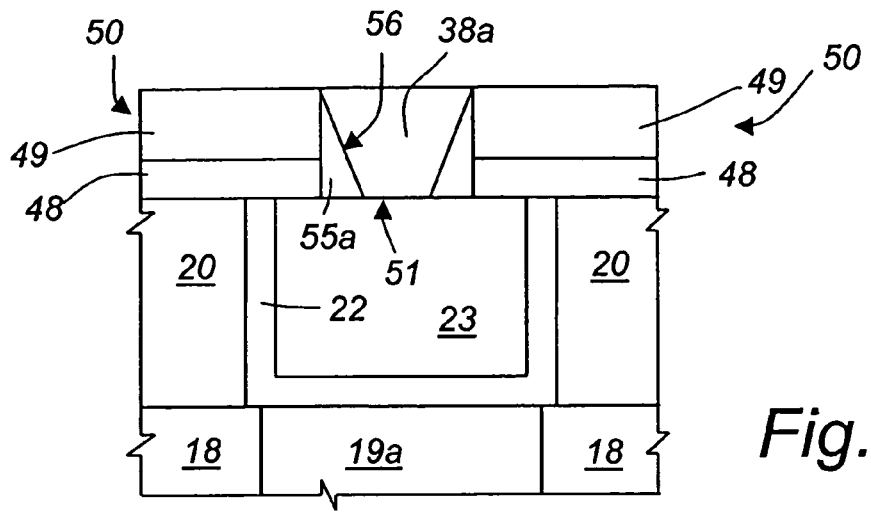

Then, a thick portion 38b of the chalcogenic layer 38, exceeding the aperture 56 is removed, preferably by CMP ("Chemical Mechanical Polishing"). The CMP process is terminated on reaching the mold layer 49: accordingly, the thin portion 38a, which is housed in the aperture 56, is left, as shown in FIG. 24. Moreover, the thin portion 38a is self-aligned to the mold layer 49. Although the chalcogenic layer 38 poorly adheres to the mold layer 49, detachment does not occur during this step, which lacks thermal stresses. As an alternative, the thick portion 38b may be removed by etch-back, using the mold layer 49 as a stop layer.

Figure 25:
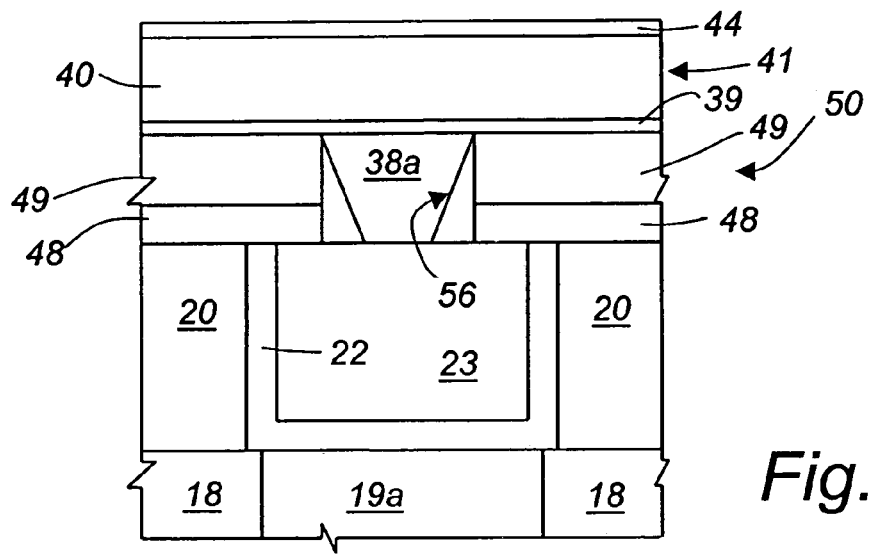

Next, a barrier layer 39, preferably of Ti/TiN, a metal layer 40, of AlCu, and a cap layer 44 of Ti or other suitable material are deposited in succession, to form a conductive stack 41 covering the mold layer 49 and the thin portion 38a (FIG. 25). The barrier layer 39 perfectly adheres to the mold layer 49 and seals the thin portion 38a inside the aperture 56, thereby preventing detachment during later steps of manufacturing.

Figure 26:
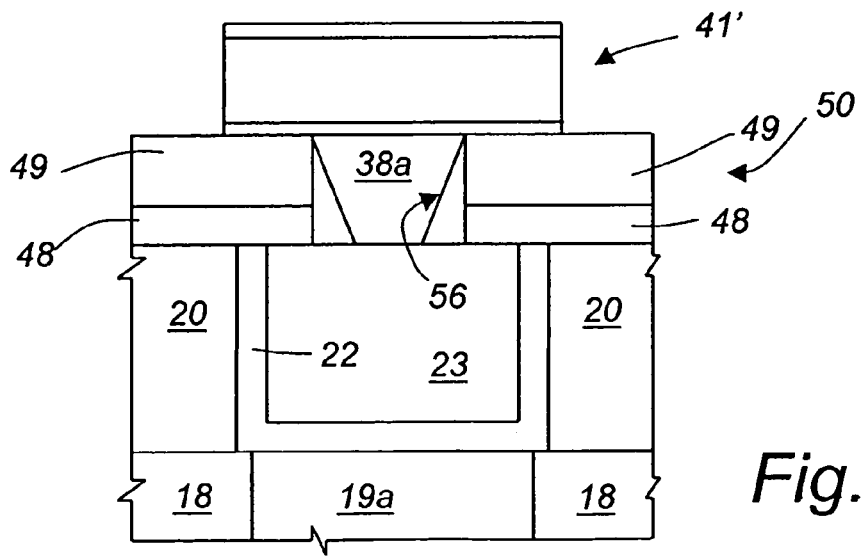

Next, the conductive stack 41 is defined using a stack mask F (FIG. 27) for forming bit lines 41' (FIG. 26).

The process continues with the steps described previously, which comprise deposition and CMP planarization of the third dielectric layer 42, opening of the third dielectric layer 42 above the base contacts 19b and above a portion (not shown) of the bit lines 41', formation of the top contacts 43, and formation of connection lines for connection to the base contacts 19b and to the bit lines 41', so as to obtain the final structure shown in FIG. 28.

The advantages of the process and structure described herein are illustrated hereinafter. First, the problems caused by the poor adhesion between chalcogenic and dielectric materials are completely overcome. In fact, since no thermal stress is involved in removing the thick portion 38b of the chalcogenide layer 38, the probability of detachment (in particular, of the thin portion 38a) is very low. In the next process step, the remaining thin portion 38a is sealed inside the strip 57.

It is also clear that the phase change memory manufactured according to the present invention has a compact structure and, especially, reduced height. The above described embodiment is particularly advantageous, since both the thick portion 38b of the chalcogenic layer 38 and the adhesion layer 28 are eliminated.

Moreover, an adhesion layer is no longer necessary, thereby simplifying the process.

Also the sequence of steps required for forming the thin portion 38a is simplified; in particular, self-aligned process steps are advantageously exploited. Furthermore the opening 51 is correctly filled, owing to the inclined walls of the spacer region 55a, as mentioned previously.

Figure 29:
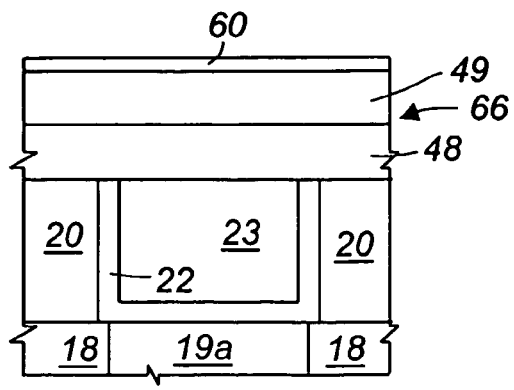
FIGS. 29–32 are cross-sections, similar to FIG. 8, in manufacture steps according to a second embodiment of the invention.
Figure 30:
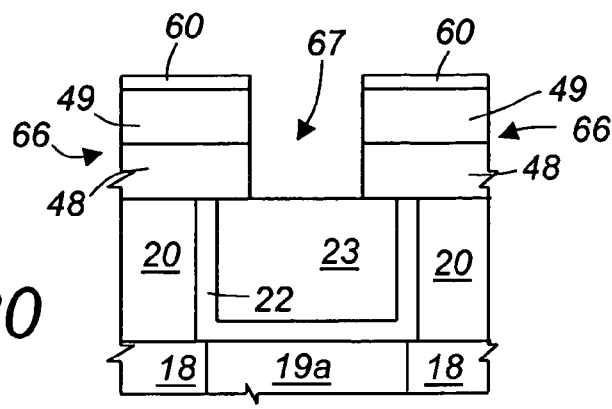
Figure 31:
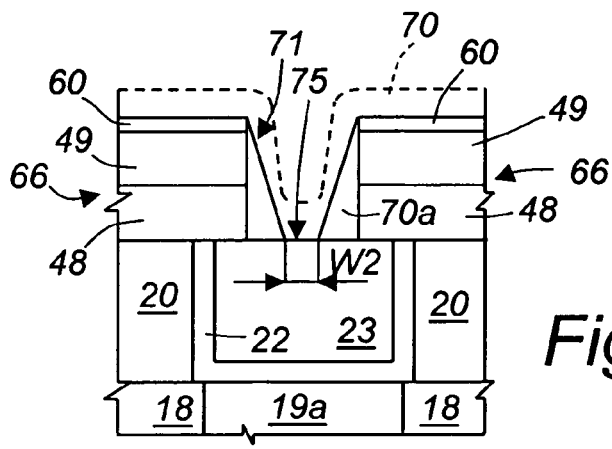

According to a second embodiment of the invention, which is illustrated in FIGS. 29–31, after forming and filling the cup-shaped regions 22, the stop layer 48, the mold layer 49 and an adhesion layer 60 are deposited, so as to form a minitrench stack 66. Then (FIG. 30), the minitrench stack 66 is etched using the minitrench mask E illustrated in FIG. 19 and an opening 67 is formed which extends vertically through the adhesion layer 60, the mold layer 49 and the stop layer 48, thereby exposing portions of the cup-shaped region 22. Moreover, the opening 67 has a rectangular shape, corresponding to that of the minitrench mask E. The width of the opening 67 in the X direction is, for example, 160 nm. The opening 67 uncovers part of the dielectric material 23 of the two adjacent cells 5 and crosses each cup-shaped region 22 only once, as can be clearly seen from the superposition of the heater mask D and minitrench mask E in FIG. 19.

Then, a spacer layer 70 (illustrated by a dotted line in FIG. 31) is deposited and anisotropically etched to form a spacer region 70a on the vertical sides of the opening 67. The spacer region 70a has inclined walls and delimits a aperture 71, the base whereof forms a rectangular strip 72 having the sublithographic width W2 (in the X direction) of approximately 60 nm. The uncovered portion of each cup-shaped region 22 forms a contact area 75.

Figure 32:
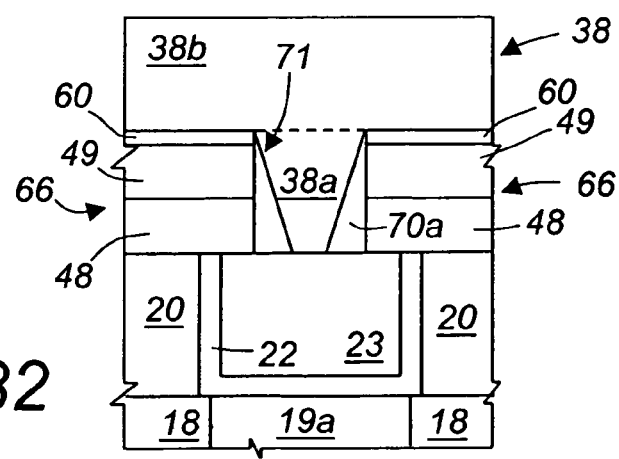

Thereafter, the chalcogenic layer 38 is deposited on the adhesion layer 60 and fills the aperture 71 with the thin portion 38a (FIG. 32). Both the thick portion 38b of the chalcogenic layer 38 exceeding the aperture 71 and the adhesion layer 60 are then completely removed by CMP process, which is terminated when the mold layer 49 is exposed. The structure already illustrated in FIG. 24 is thus obtained.

Figure 27:
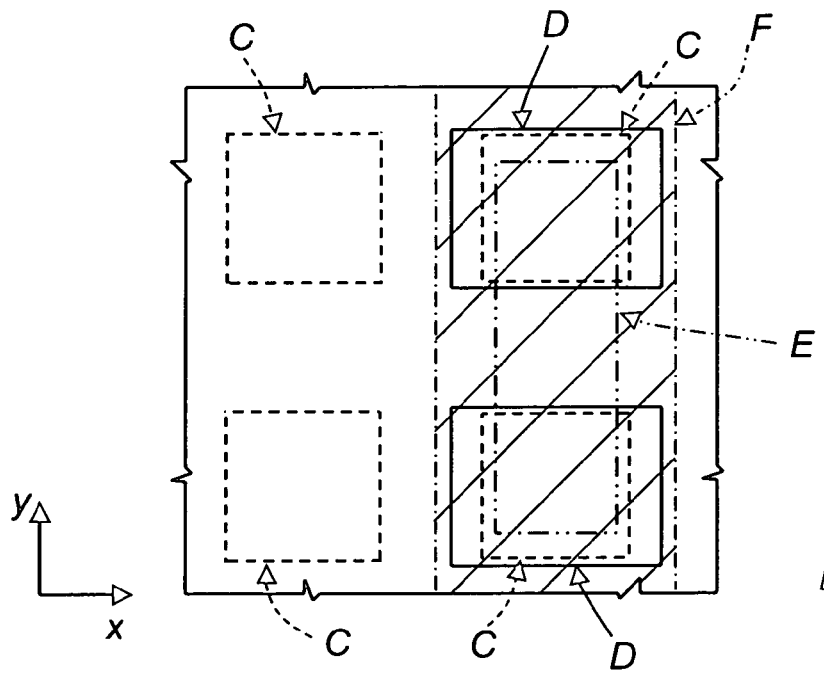
FIG. 27 shows the layout of same masks used for forming the structure of FIG. 26.

The steps already described with reference to FIGS. 25–27 are then carried out, so as to obtain the final structure shown in FIG. 28, namely deposition and shaping of the conductive stack 41 and bit lines 41', deposition and planarization of the third dielectric layer 42, opening of the third dielectric layer 42 above the base contacts 19b and above a portion (not shown) of the bit lines 41', formation of the top contacts 43, and formation of connection lines for connection to the base contacts 19b and to the bit lines 41'.

In this case, one deposition step is added, for forming the adhesion layer 60, but the probability of detachment of the chalcogenic layer 38 is substantially eliminated.

Figure 33:
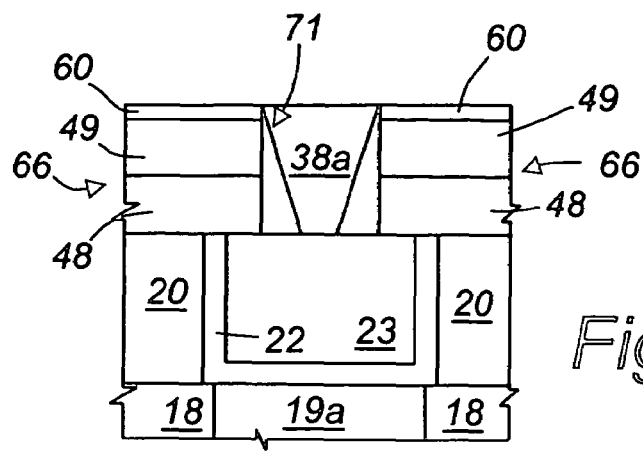
FIGS. 33–35 are cross-sections, similar to FIG. 32, in manufacture steps according to a third embodiment of the invention.

A third embodiment of the invention is illustrated in FIGS. 33–36. Initially, all the same process steps as previously described are carried out to obtain the structure shown in FIG. 32. In particular, the chalcogenic layer 38 has been deposited on the minitrench stack 66 and the thin portion 38a fills the aperture 71; moreover, the minitrench stack 66 comprises the adhesion layer 60. The thick portion 38b of the chalcogenic layer is then removed by CMP, as shown in FIG. 33. In this case, the adhesion layer 60 is used as a stop layer during the CMP process and is not removed. Hence, the thin portion 38a, which is housed in the aperture 71, is self-aligned to the adhesion layer 60. Of course, the adhesion layer 60 also delimits the thin portion 38a.

Figure 34:
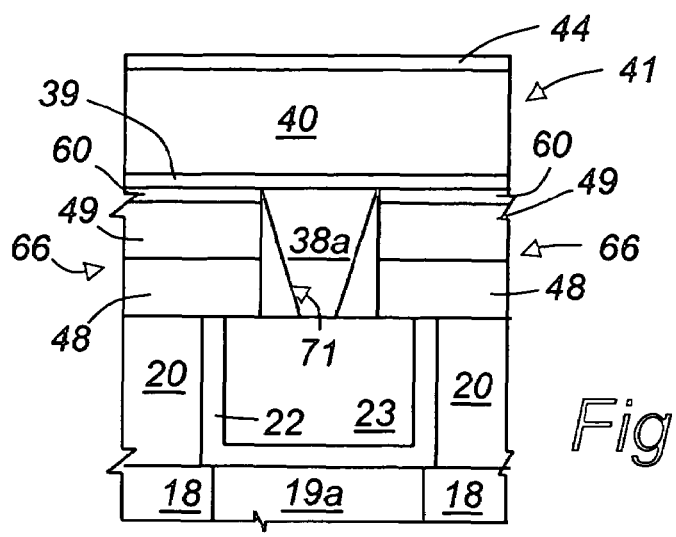

The barrier layer 39, the metal layer 40, and the cap layer 44 are deposited in succession, to form the conductive stack 41 covering the adhesion layer 60 and the thin portion 38a (FIG. 34). The barrier layer 39 perfectly adheres to the adhesion layer 60 and seals the thin portion 38a inside the aperture 71 thereby preventing detachment during later steps of manufacturing.

Figure 35:
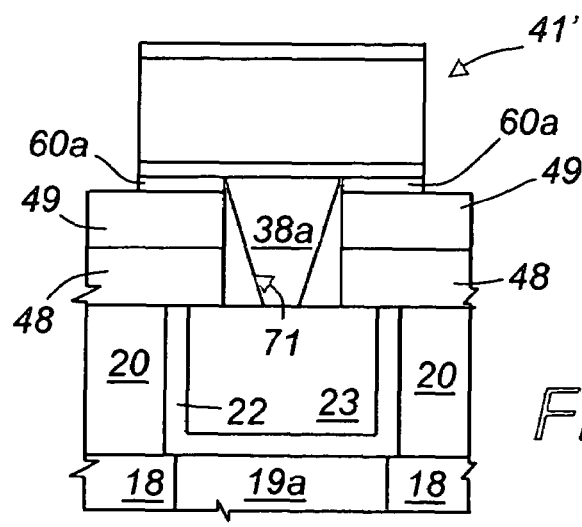

Next, the conductive stack 41 is defined using the stack mask F for forming bit lines 41' (FIG. 35). During this step, also the adhesion layer is etched, so that only residual portions 60a thereof are left between the mold layer 49 and the barrier layer 39.

Thereafter, the third dielectric layer 42 is deposited, planarized, and then opened above the base contacts 19b and above a portion (not shown) of the bit lines 41', the top contacts 43 and connection lines for connection to the base contacts 19b and to the bit lines 41' are formed. The structure illustrated in FIG. 36 is thus obtained.

Finally, it is clear that numerous modifications and variations may be made to the process and to the memory cell described and illustrated herein, all falling within the scope of the invention, as defined in the attached claims. In particular, an aperture having sublithografic width and inclined walls can be provided in any suitable manner, other than the above described one. For example, the aperture may be an opening that is long, straight and narrow slit or an opening of another shape. Moreover, although inclined walls advantageously favor filling the aperture, apertures with vertical walls can also be used.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A phase change memory cell, comprising:
    a cup-shaped resistive element having a substantially vertical wall, said vertical wall having a top surface of sublithographic thickness;
    a delimiting structure, having an aperture over said resistive element; and
    a memory portion of a phase change material, housed in said aperture, said memory portion being in direct electrical contact with the top surface of the vertical wall of the cup-shaped resistive element and defining a contact area of sublithographic extension;
    wherein said memory portion is sealed inside said aperture by a sealing structure directly lying on said delimiting structure.

2. A phase change memory cell according to claim 1, wherein said delimiting structure comprises at least a dielectric layer.

3. A phase change memory cell according to claim 2, wherein said sealing structure lies directly on said dielectric layer.

4. A phase change memory cell according to claim 2, wherein said delimiting structure comprises adhesion portions interposed between said dielectric layer and said sealing structure.

5. A phase change memory cell according to claim 1, wherein said memory portion is aligned with said delimiting structure.

6. A phase change memory cell according to claim 1, wherein said sealing structure comprises a stack of conducting layers.

7. A phase change memory cell according to claim 1, wherein said resistive element includes a first thin portion having a first sublithographic dimension in a first direction and said memory portion has a second sublithographic dimension in a second direction transverse to said first direction; said contact area of sublithographic extension having substantially said first sublithographic dimension in said first direction and said second sublithographic dimension in said second direction.

8. The memory cell according to claim 7, wherein said memory portion has a substantially elongated shape with a main dimension extending parallel to said first direction.

9. A phase change memory cell according to claim 1 wherein said aperture is a slit.

10. The memory device according to claim 1 wherein a width of contact area is substantially the same as the thickness of the vertical wall of the cup-shaped resistive element.

11. The memory device of claim 1 wherein the cup-shaped resistive element is filled, within the substantially vertical wall, with a dielectric material.

12. A memory device comprising:
    a selection element; and
    a phase change memory element coupled to said selection element, said phase change memory element having a cup-shaped resistive element having a substantially vertical wall, said vertical wall having a top surface of sublithographic thickness; a delimiting structure having an aperture over said resistive element; and a memory portion of a phase change material, housed in said aperture, said resistive element and said memory portion being in direct electrical contact and defining a contact area of a first dimension of less than 100 nm and a second dimension of less than 100 nm, said second dimension being substantially perpendicular to said first dimension, wherein said memory portion is sealed inside said aperture by a sealing structure directly lying on said delimiting structure.

13. A memory device according to claim 12 wherein said selection element is a transistor.

14. A memory device according to claim 12 wherein said selection element is a diode.

15. A memory device according to claim 12 wherein said aperture is a slit.

16. A memory device comprising:
a first cup-shaped resistive element having a substantially vertical wall, said vertical wall having a top surface of sublithographic thickness;
a second cup-shaped resistive element having a substantially vertical wall, said vertical wall having a top surface of sublithographic thickness;
a delimiting structure with an aperture having a first portion over the first cup-shaped resistive element and a second portion over the second cup-shaped resistive element;
a first memory portion of phase change material in the first portion of said aperture, the first memory portion being in contact with the first resistive element and defining a first contact area of sublithographic dimension;
a second memory portion of phase change material in the second portion of said aperture, the second memory portion being in contact with the second resistive element and defining a second contact area of sublithographic dimension; and
a sealing structure directly lying on said delimiting structure, sealing the first memory portion and the second memory portion in said aperture.

17. The memory device according to claim 16 wherein said aperture is a slit.

18. A memory device comprising:
a resistive element having a top surface, an elongated-shaped portion of said top surface having a first width of sublithographic dimension;
a delimiting structure overlying and transversing the elongated-shaped portion of the top surface of the resistive element, the delimiting structure defining a slit having a second width of sublithographic dimension,
a phase change material in the slit and in direct electrical contact with the resistive element by a contact area, said contact area having a first dimension substantially the same as the first width of the resistive element, and a second dimension substantially the same as the second width of the slit; and
a sealing structure directly lying on said delimiting structure sealing the phase change material within the slit.

19. The memory device of claim 18 wherein the first dimension of the contact area is about 60 nm or less, and the second dimension of the contact area is about 60 nm or less.

20. The memory device of claim 18 further comprising a selection element.

21. A phase change memory cell, comprising:
a cup-shaped resistive element having a substantially vertical wall, said vertical wall having a top surface of sublithographic thickness;
a delimiting structure having an aperture over said cup-shaped resistive element, the delimiting structure having a top surface;
a sealing structure positioned directly on and contacting a top surface of the delimiting structure, the sealing structure and the delimiting structure having a substantially similar width and together forming a stack; and
a memory portion of a phase change material housed in said aperture and sealed within the stack, said memory portion being in direct electrical contact with the top surface of the vertical wall of the cup-shaped resistive element and defining a contact area of sublithographic extension.

22. The phase change memory cell of claim 21 wherein the delimiting structure comprises a dielectric layer and the sealing structure contacts the dielectric layer.

23. The phase change memory cell of claim 21 wherein the delimiting structure comprises an adhesion layer overlying a dielectric layer, and the sealing structure contacts the adhesion layer.

24. A phase change memory cell, comprising:
a cup-shaped resistive element having a substantially vertical wall, said vertical wall having a top surface of sublithographic thickness;
a delimiting structure having an aperture over said resistive element, the delimiting structure having a top surface;
a memory portion of a phase change material, housed in said aperture without exceeding the aperture, said memory portion being in direct electrical contact with the top surface of the vertical wall of the cup-shaped resistive element and defining a contact area of sublithographic extension; and
a sealing structure contacting the top surface of the delimiting structure and sealing the memory portion within the aperture.

25. The phase change memory cell of claim 24 wherein the delimiting structure comprises a dielectric layer and the sealing structure contacts the dielectric layer.

26. The phase change memory cell of claim 24 wherein the delimiting structure comprises an adhesion layer overlying a dielectric layer, and the sealing structure contacts the adhesion layer.

* * * * *